(12) United States Patent
Hussell et al.

(10) Patent No.: US 8,648,359 B2
(45) Date of Patent: Feb. 11, 2014

(54) LIGHT EMITTING DEVICES AND METHODS

(75) Inventors: Christopher P. Hussell, Cary, NC (US); David T. Emerson, Chapel Hill, NC (US); Jeffrey C. Britt, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/227,961

(22) Filed: Sep. 8, 2011

(65) Prior Publication Data

US 2012/0127720 A1    May 24, 2012

Related U.S. Application Data

(63) Continuation-in-part of application No. 12/825,075, filed on Jun. 28, 2010.

(60) Provisional application No. 61/404,985, filed on Oct. 13, 2010.

(51) Int. Cl.
   *H01L 23/52* (2006.01)

(52) U.S. Cl.
   USPC ............................................ 257/88; 362/227

(58) Field of Classification Search
   USPC .................... 257/88; 362/249.02, 227; 29/825
   See application file for complete search history.

(56) References Cited

U.S. PATENT DOCUMENTS

| | | | |
|---|---|---|---|
| 34,861 A | 4/1862 | Knowlton | |
| 4,679,118 A | 7/1987 | Johnson et al. | |
| 4,946,547 A | 8/1990 | Palmour | |
| 5,200,022 A | 4/1993 | Kong | |
| 5,210,051 A | 5/1993 | Carter, Jr. | |
| 5,393,993 A | 2/1995 | Edmond | |
| 5,506,446 A | 4/1996 | Hoffman et al. | |
| 5,523,589 A | 6/1996 | Edmond | |
| 6,274,924 B1 | 8/2001 | Carey et al. | |
| 6,498,355 B1 | 12/2002 | Harrah | |
| 6,610,563 B1 | 8/2003 | Waitl | |
| 6,828,170 B2 | 12/2004 | Roberts et al. | |
| 6,936,855 B1 | 8/2005 | Harrah | |
| 6,943,433 B2 | 9/2005 | Kamada | |
| D514,073 S | 1/2006 | Suenaga | |
| 7,081,661 B2 | 7/2006 | Takehara et al. | |
| 7,224,047 B2 | 5/2007 | Carberry et al. | |
| 7,244,965 B2 | 7/2007 | Andrews et al. | |

(Continued)

FOREIGN PATENT DOCUMENTS

| | | |
|---|---|---|
| CN | 200930286397.5 | 10/2010 |
| CN | ZL 2011-30010728 | 1/2012 |

(Continued)

OTHER PUBLICATIONS

Non-Final Office Action for Korean Application Serial No. KR 30-2010-0047048 dated Dec. 15, 2011.

(Continued)

*Primary Examiner* — Roy Potter
(74) *Attorney, Agent, or Firm* — Jenkins, Wilson, Taylor & Hunt, P.A.

(57) ABSTRACT

Light emitting devices and methods such as light emitting diodes (LEDs) are disclosed for use in higher voltage applications. Variable arrangements of LEDs are disclosed herein. Arrangements can include one or more LED chips connected in series, parallel, and/or a combination thereof. LED chips can be disposed in a package body having at least one thermal element and one or more electrical components.

17 Claims, 9 Drawing Sheets

(56) References Cited

U.S. PATENT DOCUMENTS

| | | | |
|---|---|---|---|
| D566,055 S | 4/2008 | Kim | |
| 7,361,940 B2 | 4/2008 | Kim et al. | |
| D573,113 S | 7/2008 | Bando | |
| D573,114 S | 7/2008 | Min et al. | |
| 7,400,049 B2 | 7/2008 | Shim | |
| 7,429,790 B2 | 9/2008 | Condie et al. | |
| 7,432,589 B2 | 10/2008 | Yamamoto et al. | |
| D580,375 S | 11/2008 | Yen | |
| D580,381 S | 11/2008 | Bando | |
| D580,891 S | 11/2008 | Sung et al. | |
| 7,456,499 B2 | 11/2008 | Loh | |
| 7,462,870 B2 | 12/2008 | Nakashima | |
| D584,699 S | 1/2009 | Bando | |
| D594,827 S | 6/2009 | Loh et al. | |
| D595,675 S | 7/2009 | Wang et al. | |
| 7,564,180 B2 | 7/2009 | Brandes | |
| 7,566,159 B2 | 7/2009 | Oon et al. | |
| D597,968 S | 8/2009 | Kobayakawa et al. | |
| D597,971 S | 8/2009 | Kobayakawa et al. | |
| D598,400 S | 8/2009 | Bando | |
| 7,592,638 B2 | 9/2009 | Kim | |
| 7,659,551 B2 | 2/2010 | Loh | |
| D614,592 S | 4/2010 | Hussell et al. | |
| 7,692,206 B2 | 4/2010 | Loh | |
| D615,504 S | 5/2010 | Keller et al. | |
| 7,719,024 B2 | 5/2010 | Bando | |
| D621,798 S | 8/2010 | Lu et al. | |
| D621,799 S | 8/2010 | Hussell et al. | |
| D622,680 S | 8/2010 | Lin et al. | |
| 7,791,061 B2 | 9/2010 | Edmond et al. | |
| D626,095 S | 10/2010 | Hsieh | |
| D627,310 S | 11/2010 | Lin et al. | |
| D628,541 S | 12/2010 | Lin | |
| 7,852,015 B1 | 12/2010 | Yen et al. | |
| D632,267 S | 2/2011 | Chen et al. | |
| D632,659 S | 2/2011 | Hsieh | |
| D634,284 S | 3/2011 | Ko et al. | |
| D634,285 S | 3/2011 | Ko et al. | |
| D634,286 S | 3/2011 | Ko et al. | |
| D634,716 S | 3/2011 | Suzuki | |
| D635,527 S | 4/2011 | Hussell et al. | |
| 7,923,739 B2 | 4/2011 | Hussell | |
| D641,719 S | 7/2011 | Hussell et al. | |
| D643,819 S | 8/2011 | Joo | |
| D648,686 S | 11/2011 | Hussell et al. | |
| D648,687 S | 11/2011 | Joo et al. | |
| D658,599 S | 5/2012 | Takahashi et al. | |
| D659,657 S | 5/2012 | Hussell et al. | |
| D661,264 S | 6/2012 | Joo et al. | |
| D667,801 S | 9/2012 | Joo et al. | |
| 8,269,244 B2 | 9/2012 | Hussell | |
| 8,354,992 B2 | 1/2013 | Rumreich et al. | |
| D679,842 S | 4/2013 | Joo et al. | |
| 8,497,522 B2 | 7/2013 | Hussell | |
| 2001/0045640 A1 | 11/2001 | Oida et al. | |
| 2004/0075100 A1 | 4/2004 | Bogner et al. | |
| 2004/0079957 A1 | 4/2004 | Andrews et al. | |
| 2005/0269587 A1 | 12/2005 | Loh et al. | |
| 2006/0043401 A1 | 3/2006 | Lee et al. | |
| 2006/0118808 A1 | 6/2006 | Ishidu et al. | |
| 2006/0157726 A1 | 7/2006 | Loh et al. | |
| 2006/0186418 A1 | 8/2006 | Edmond et al. | |
| 2006/0220050 A1 | 10/2006 | Higaki et al. | |
| 2007/0052074 A1 | 3/2007 | Hasegawa | |
| 2007/0057364 A1 | 3/2007 | Wang et al. | |
| 2007/0075325 A1 | 4/2007 | Baek et al. | |
| 2007/0114514 A1 | 5/2007 | Ito | |
| 2007/0262328 A1 | 11/2007 | Bando | |
| 2008/0006837 A1 | 1/2008 | Park et al. | |
| 2008/0023722 A1 | 1/2008 | Lee et al. | |
| 2008/0185605 A1 | 8/2008 | Wada et al. | |
| 2008/0258130 A1 | 10/2008 | Bergmann et al. | |
| 2008/0258162 A1 | 10/2008 | Koung et al. | |
| 2008/0278941 A1 | 11/2008 | Logan et al. | |
| 2008/0283849 A1 | 11/2008 | Imai | |
| 2008/0290353 A1 | 11/2008 | Medendorp | |
| 2009/0008662 A1 | 1/2009 | Ashdown et al. | |
| 2009/0101921 A1 | 4/2009 | Lai | |
| 2009/0122533 A1 | 5/2009 | Brukilacchio | |
| 2009/0159905 A1 | 6/2009 | Chen | |
| 2009/0189178 A1 | 7/2009 | Kim et al. | |
| 2009/0267085 A1 | 10/2009 | Lee et al. | |
| 2009/0321779 A1 | 12/2009 | Kim et al. | |
| 2010/0059783 A1 | 3/2010 | Chandra | |
| 2010/0102345 A1 | 4/2010 | Kong et al. | |
| 2010/0133554 A1 | 6/2010 | Hussell | |
| 2010/0133578 A1 | 6/2010 | Pickard et al. | |
| 2010/0155748 A1 | 6/2010 | Chan et al. | |
| 2010/0163887 A1 | 7/2010 | Kim et al. | |
| 2010/0181582 A1 | 7/2010 | Li et al. | |
| 2010/0270577 A1 | 10/2010 | Rulkens et al. | |
| 2011/0006658 A1 | 1/2011 | Chan | |
| 2011/0031865 A1 | 2/2011 | Hussell et al. | |
| 2011/0180827 A1 | 7/2011 | Hussell | |
| 2011/0186873 A1 | 8/2011 | Emerson | |
| 2011/0316022 A1 | 12/2011 | Hussell | |
| 2012/0069560 A1* | 3/2012 | Miskin et al. | 362/227 |
| 2012/0153317 A1 | 6/2012 | Emerson et al. | |
| 2013/0003375 A1 | 1/2013 | Hussell | |
| 2013/0011946 A1 | 1/2013 | Hussell | |

FOREIGN PATENT DOCUMENTS

| | | |
|---|---|---|
| CN | ZL201130171313.0 | 4/2012 |
| EP | 00124223 | 1/2011 |
| EP | 2 438 631 | 4/2012 |
| EP | 2 603 930 | 6/2013 |
| EP | 2 628 196 | 8/2013 |
| JP | D1102760 | 3/2001 |
| JP | 2002-280616 | 9/2002 |
| JP | 2005-179147 | 7/2005 |
| JP | 2005-209763 | 8/2005 |
| JP | 2007-108547 | 4/2007 |
| JP | 2008-091792 | 4/2008 |
| JP | 2008-098218 | 4/2008 |
| JP | 2008-103480 | 5/2008 |
| JP | 2008-545269 | 12/2008 |
| JP | D1346959 | 12/2008 |
| JP | 2009-016636 | 1/2009 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 1020070000130 A | 1/2007 |
| KR | 10-0845856 | 7/2008 |
| KR | 1020090003378 A | 1/2009 |
| KR | 30-0681227 | 3/2011 |
| KR | 30-0697636 | 6/2013 |
| TW | 100305347 | 3/2012 |
| TW | D146222 | 4/2012 |
| TW | D148144 | 7/2012 |
| WO | WO 2006/059828 | 6/2006 |
| WO | WO 2007/126720 | 11/2007 |
| WO | WO 2008/021268 | 2/2008 |
| WO | WO 2010/141215 | 12/2010 |
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/109225 | 8/2012 |
| WO | WO 2012/151270 | 11/2012 |

OTHER PUBLICATIONS

Non-Final Office Action for Korean Application Serial No. KR 30-2010-0047049 dated Dec. 15, 2011.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.

(56) References Cited

OTHER PUBLICATIONS

Notice of Allowance for U.S. Appl. No. 29/401,692, dated Jan. 20, 2012.
Notice of Allowance for U.S. Appl. No. 29/403,433, dated Feb. 2, 2012.
International Search Report for Application Serial No. TW 100305347 dated Mar. 5, 2012.
Japanese Notice of Allowance for Application Serial No. JP 2011-017747 dated Mar. 13, 2012.
Communication of European publication number and information on the application of Article 67(3) EPC dated Mar. 14, 2012.
Non-Final Office Action for U.S. Appl. No. 13/082,699, dated Apr. 13, 2012.
Notice of Allowance for U.S. Appl. No. 29/397,017, dated May 17, 2012.
Notice of Allowance for U.S. Appl. No. 12/853,812, dated May 21, 2012.
International Search Report and Written Opinion for Application Serial No. PCT/US2011/054560 dated May 22, 2012.
Description Model No. NS6x083x issued by Nichia Corporation—at least as early as Feb. 17, 2007.
Description Model No. NS6G083 issued by Nichia Corporation—at least as early as Aug. 31, 2007.
Notice of Allowance dated Apr. 16, 2010 from U.S. Appl. No. 29/338,186.
Design U.S. Appl. No. 29/360,791, filed Apr. 30, 2010.
Non-Final Office Action for U.S. Appl. No. 12/479,318, dated Jun. 2, 2010.
Related Design U.S. Appl. No. 29/365,939, filed Jul. 16, 2010.
U.S. Appl. No. 12/853,812, filed Aug. 10, 2010.
Notice of Allowance for U.S. Appl. No. 29/353,652, dated Aug. 24, 2010.
U.S. Appl. No. 61/404,985, filed Oct. 13, 2010.
Non-final Office Action for U.S. Appl. No. 12/479,318, dated Nov. 10, 2010.
Notice of Allowance for U.S. Appl. No. 29/353,652, dated Nov. 26, 2010.
Supplemental Notice of Allowance for U.S. Appl. No. 29/353,652, dated Dec. 8, 2010.
U.S. Appl. No. 12/969,267, filed Dec. 15, 2010.
Notice of Allowance for U.S. Appl. No. 29/360,791, dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application No. 001283600-0001-0003 dated Jan. 7, 2011.
U.S. Appl. No. 13/011,609, filed Jan. 21, 2011.
Supplemental Notice of Allowance for U.S. Appl. No. 29/360,791, dated Jan. 24, 2011.
Notice of Allowance for U.S. Appl. No. 12/479,318, dated Feb. 17, 2011.
Notice of Allowance for U.S. Appl. No. 29/338,186, dated Mar. 10, 2011.
Notice of Allowance for Japanese Design Appl. No. 2010-026186 dated Mar. 29, 2011.
Supplemental Notice of Allowability for U.S. Appl. No. 12/479,318, dated Apr. 5, 2011.
Japanese Office Action for JP2010-026185 dated Apr. 5, 2011.
Notice of Allowance for Design U.S. Appl. No. 29/360,791, dated Apr. 12, 2011.
Notice of Allowance for Design U.S. Appl. No. 29/365,939, dated Apr. 12, 2011.
Supplemental Notice of Allowance for Design U.S. Appl. No. 29/338,186, dated May 20, 2011.
Taiwanese Office Action for Appl. No. 099305566 dated Jul. 12, 2011.
Notice of Allowance for Design U.S. Appl. No. 29/360,791, dated Jul. 21, 2011.
Notice of Allowance for Design U.S. Appl. No. 29/380,549, dated Jul. 28, 2011.
Office Action with Restriction/Election Requirement for U.S. Appl. No. 12/853,812, dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812, dated Dec. 7, 2011.
International Preliminary Report on Patentability for PCT Application Serial No. PCT/US2010/035379 dated Dec. 8, 2011.
Notice of Allowance for U.S. Appl. No. 29/397,017, dated Dec. 9, 2011.
Hyun-Ho Kim et al., Thermal Transient Characteristics of Die Attach in High Power LED PKG, Microelectronics Reliability, vol. 48, Issue 3, Mar. 2008, pp. 445-454.
Taiwanese Notice of Allowance for Application No. 100305347 dated Mar. 23, 2012.
Certificate of Design Patent for Chinese Application No. CN ZL 201130171313 dated May 7, 2012.
Certificate of Design Patent for Application Serial No. CN ZL 201130210595 dated Jun. 11, 2012.
Certificate of Design Patent for Application Serial No. CN ZL 201030577293 dated May 23, 2012.
International Search Report for Application Serial No. PCT/US2012/023285 dated Jun. 27, 2012.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/024122 dated Jul. 11, 2012.
Supplemental Notice of Allowance for U.S. Appl. No. 29/397,017, dated Jul. 23, 2012.
Notification Concerning Availability of the Publication Serial No. PCT/US2012/023285 dated Aug. 9, 2012.
Notification Concerning Availability of the Publication Serial No. PCT/US2012/024122 dated Aug. 16, 2012.
Korean Office Action for Application Serial No. KR 30-2010-0047049 dated Sep. 12, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notice of Allowance for U.S. Appl. No. 13/082,699 dated Oct. 23, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394, dated Nov. 27, 2012.
Supplemental Notice of Allowance for U.S. Appl. No. 29/382,394, dated Jan. 14, 2013.

(56) References Cited

OTHER PUBLICATIONS

Non-Final Office Action for U.S. Appl. No. 12/969,267, dated Mar. 29, 2013.
Non-Final Office Action for U.S. Appl. No. 13/011,609, dated Jun. 7, 2013.
Non-Final Office Action for U.S. Appl. No. 13/616,759, dated Jul. 11, 2013.
Notice of Allowance for U.S. Appl. No. 12/825,075, dated Jul. 31, 2013.
Notice of Allowance for U.S. Appl. No. 13/462,450, dated Aug. 1 2013.
Notice of Allowance from U.S. Appl. No. 29/330,657, dated Sep. 25, 2009.
Restriction Requirement for U.S. Appl. No. 29/382,394, dated Jul. 17, 2012.
Non-Final Office Action for U.S. Appl. No. 13/462,450, dated Jan. 15, 2013.
Non-Final Office Action for U.S. Appl. No. 12/825,075, dated Feb. 1, 2013.
Notice of Allowance for U.S. Appl. No. 13/082,699, dated Apr. 3, 2013.
Korean Notice of Allowance for Application No. 30-2010-0047049 dated Apr. 4, 2013.
Extended European Search Report for Application No. EP 10 78 3782 dated Nov. 22, 2013.
Japanese Office Action for Application No. 2012-513966 dated Dec. 9, 2013.

* cited by examiner

LIGHT EMITTING DEVICES AND METHODS

CROSS REFERENCE TO RELATED APPLICATIONS

This application relates and claims priority to U.S. Provisional Patent Application Ser. No. 61/404,985 filed Oct. 13, 2010 and is a continuation-in-part application from co-pending U.S. utility patent application Ser. No. 12/825,075 filed Jun. 28, 2010, the entire contents of which are hereby incorporated by reference herein.

TECHNICAL FIELD

The subject matter disclosed herein relates generally to light emitting devices and methods. More particularly, the subject matter disclosed herein relates to light emitting devices and methods for use in higher voltage applications.

BACKGROUND

Light emitting devices, such as light emitting diodes (LEDs), may be utilized in products for providing white light (e.g., perceived as being white or near-white), and are developing as replacements for incandescent, fluorescent, and metal halide light products. A representative example of an LED lamp comprises a package having at least one LED chip, a portion of which can be coated with a phosphor such as, for example, yttrium aluminum garnet (YAG). The LED chip can produce an emission of a desired wavelength within the LED lamp, and the phosphor can in turn emit yellow fluorescence with a peak wavelength of about 550 nm on receiving the emission. At least a portion of the emission from LED chip can be transmitted through the phosphor, while at least a portion can be absorbed by the phosphor. The portion of the light that is transmitted through the phosphor is mixed with the yellow light emitted by the phosphor, and the viewer perceives the mixture of light emissions as white light. As an alternative to phosphor-converted white light, red, blue, and green (RGB) light emitting devices may be operated in combination to produce light that is perceived as white. Conventional LEDs, packages and methods producing white light can be designed for lower voltage applications.

Despite availability of various LEDs and LED packages in the marketplace, a need remains for improved packages suitable for applications such as those utilizing higher voltages, to enhance light output performance, enhance thermal performance, improve device reliability, and to promote ease of manufacture.

SUMMARY

In accordance with this disclosure, novel light emitting devices and methods are provided that are capable of adapting to various application and electrical requirements. It is, therefore, an object of the subject matter disclosed herein to provide light emitting devices and methods comprising improved reliability in higher voltage applications.

These and other objects of the present disclosure as can become apparent from the disclosure herein are achieved, at least in whole or in part, by the subject matter described herein.

BRIEF DESCRIPTION OF THE DRAWINGS

A full and enabling disclosure of the subject matter disclosed herein including the best mode thereof to one of ordinary skill in the art is set forth more particularly in the remainder of the specification, including reference to the accompanying figures, in which.

DETAILED DESCRIPTION

Figure 1:
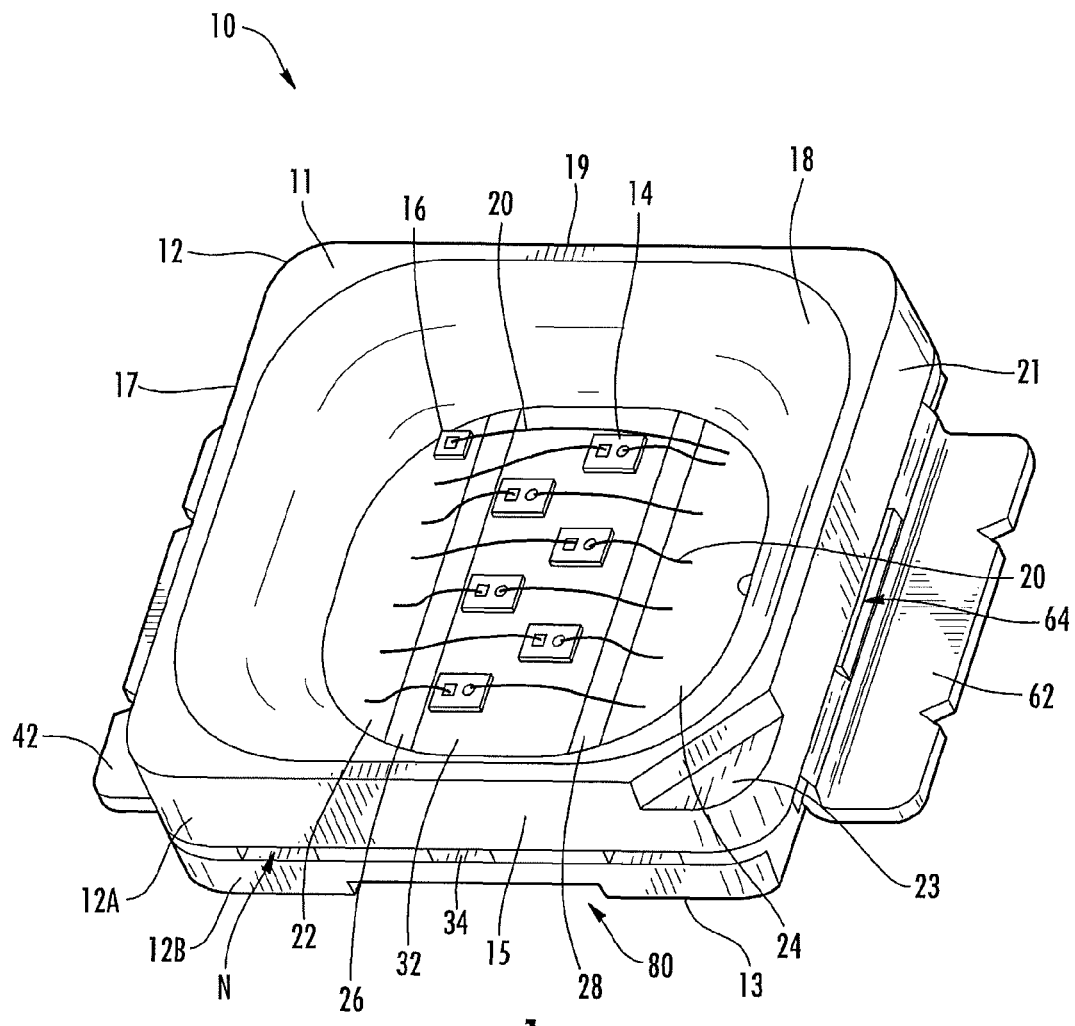
FIG. 1 illustrates a perspective top view of a light emitting diodes (LED) package and LEDs according to an aspect of the subject matter herein.

Reference will now be made in detail to possible aspects or embodiments of the subject matter herein, one or more examples of which are shown in the figures. Each example is provided to explain the subject matter and not act as a limitation. In fact, features illustrated or described as part of one aspect or embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the subject matter disclosed herein. Furthermore, various aspects of the subject matter disclosed herein are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the subject matter herein, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. patents including: U.S. Pat. Nos. 5,210,051; 5,393,993; and 5,523,589, the disclosures of which are hereby incorporated by reference herein in their entireties.

Although various embodiments of LEDs disclosed herein may include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter disclosed herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board, or wire bonded. A vertical device (without or without the growth substrate) may have a first terminal solder bonded to a carrier substrate or printed circuit board and a second terminal wire bonded to the carrier substrate or printed circuit board. Examples of vertical and horizontal LED chip structures are discussed by way of example in U.S. Publication No. 2008/0258130 to Bergmann et al. and in U.S. Pat. No. 7,791,061 to Edmond et al., the disclosures of which are hereby incorporated by reference herein in their entireties.

Referring now to FIGS. 1-12B, FIG. 1 illustrates a top perspective view of one aspect or embodiment of a light emitting device and package, for example an LED package, generally designated 10. LED package 10 can comprise a body 12 that can defining a reflector cavity 18 and housing one or more LED chips 14 mounted over an upper surface of one or more thermal elements. LED chips 14 can either mount directly to a thermal element, or upon one or more intervening substrates (not shown) between the one or more LED chips 14 and thermal element. LED chips 14 can thermally connect to the one or more thermal elements. LED chips 14 can electrically connect to one or more electrical components. LED package 10 can further comprise an electrostatic discharge (ESD) protection device 16 mounted over a top surface of an electrical component. For example, ESD protection device 16 can comprise a Zener diode, ceramic capacitor, transient voltage suppression (TVS) diode, multilayer varistor, a Shottky diode and/or any other ESD device known in the art. ESD protection device 16 can electrically communicate with first and second electrical components through for example, an electrically conductive wire 20 using wirebonding technology.

Still referring to FIG. 1, body 12 can comprise an upper face 11, a lower face 13 and at least one exterior side wall. Upper face 11 can comprise a corner notch 23 that can convey electrical properties of the package, for example, the side of body 12 comprising the cathode and/or anode. Lower face can comprise one or more recesses generally designated 80 defined therein. In one aspect, body 12 can comprise four exterior side walls 15, 17, 19, and 21, respectively. In other aspects, body 12 can comprise only one exterior wall thereby forming a substantially round body. Exterior walls 15, 17, 19, and 21 can comprise a substantially similar and/or substantially equal length dimension such that LED package 10 comprises a substantially square footprint. In other aspects, the length of the one or more exterior walls may be unequal such that body 12 comprises a rectangular footprint and/or any other shaped footprint desired by the manufacturer and/or an end user. For example, body 12 can comprise a substantially rounded footprint, or a footprint comprising regular and/or irregular polygonal shapes.

Body 12 can comprise any suitable material, such as for example a material selected from the group consisting of molded plastic, thermoset plastic, thermoplastic, polymeric, ceramic, nylon, liquid crystal polymer (LCP), reinforced polymers (polymers comprising fibers, ceramics, or composites), and polyphthalamide (PPA) wherein body 12 can be disposed around thermal and electrical components thereby retaining such elements. For example, body 12 can form about a thermal element comprising a heat transfer material 32. Body 12 can simultaneously form about one or more electrical components comprising for example, first and second electrical lead components 22 and 24, respectively. In one aspect, body 12 can be form using a molding process, such as injection molding a thermoplastic and/or thermoset material that can be electrically insulating. Any other forming method known in the art may be used, however, including sintering and/or molding in combination with sintering. Body 12 can be white or otherwise light in color to minimize light absorbed by LED package 10. In addition, body 12 can comprise an upper body portion 12A and a lower body portion 12B as may be formed, for example, in upper and lower molding die portions (not shown) respectively. Reflector cavity 18 can form, for example, as the inverse of a central protrusion of an upper molding die. One or more isolating portions of the body may form between respective thermal and electrical components. For example first and second isolating portions 26 and 28 can form which can electrically and/or thermally isolate one or more thermal elements from one or more electrical components. During or after formation of the body, one or more LED chips 14 can mount over heat transfer material 32 and electrically connect to one or both first and second lead components 22 and 24, respectively, using conductive wire 20.

Figure 2:
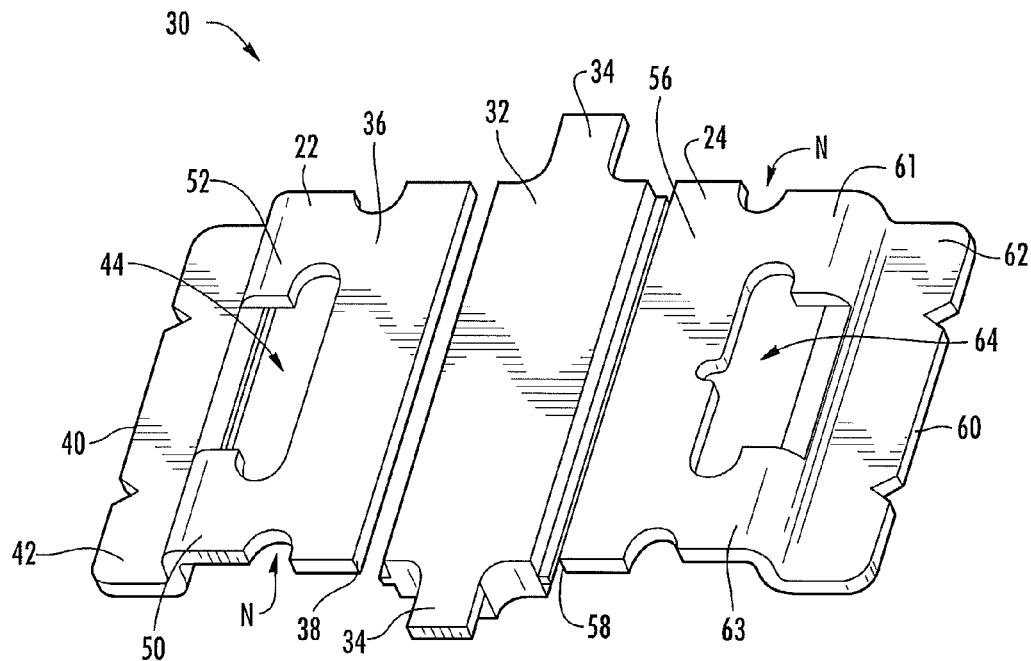
FIG. 2 illustrates a perspective view of components of LED packages according to an aspect of the subject matter herein.
Figure 3:
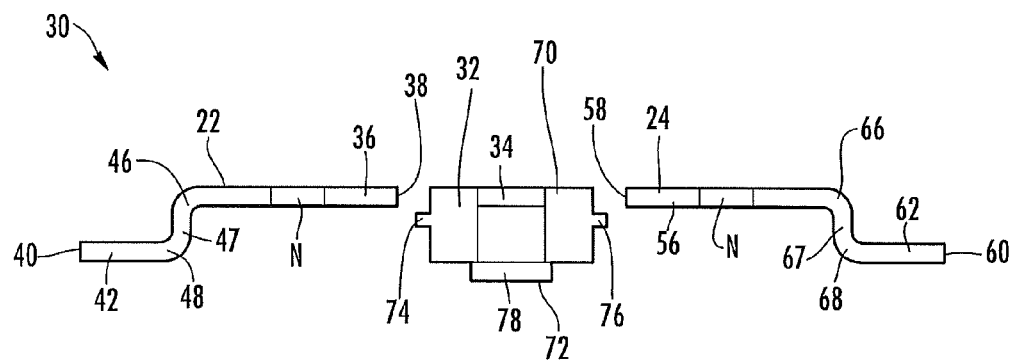
FIG. 3 illustrates an end view of LED components shown in FIG. 2.

Referring now to FIGS. 2 and 3, a leadframe element, generally designated 30, is shown. Leadframe element 30 can comprise at least one thermal element and one or more electrical components. Thermal element can comprise heat transfer material 32 or substrate such as, for example, a heat slug. Thermal element can be isolated, electrically and/or thermally from one or more electrical components. Electrical components can comprise first and second lead components 22 and 24, respectively. First and second lead components 22 and 24 may also be collectively referred to as "leads". Thermal element 32 can optionally be disposed between respective medial ends 38 and 58 of first and second lead components 22 and 24, respectively. Body 12 can be molded, disposed, or otherwise formed about leadframe element 30 such that heat transfer material 32 can be disposed on a bottom floor of reflector cavity 18. Body 12 can encase at least a portion of leadframe element 30 thereby retaining portions of heat transfer material 32 and portions of first and second lead components 22 and 24, respectively. One or more protruding portions 34 of heat transfer material can be exposed along external walls 15 and 19 of body 12 to assist with retention of heat transfer material 32.

One or more leadframe elements 30 can initially comprise a sheet (not shown) of elements. The leadframe elements 30 can be formed and/or singulated from the sheet using any suitable method, for example, stamping, cutting, and/or bending one or more portions of the sheet and/or leadframe elements 30 within the sheet. Body 12 of LED package 10 can form about at least a portion of leadframe element 30 and a multitude of LED package subassemblies can be formed about the sheet of leadframe elements 30. The multitude of LED package subassemblies can be separated into individual LED packages 10 by cutting, shearing, or otherwise separating adjacent to exterior walls 15 and 19 and terminal ends 40 and 60 of the first and second lead components, 22, and 24, respectively, from the sheet of elements. Such separation can expose protruding portions 34 of heat transfer material 32 along exterior walls 15 and 19 of each LED package 10.

Still referring to FIGS. 2-3, electrical components comprising first and second lead components 22 and 24 formed from a leadframe element 30 are disclosed. First and second lead components 22 and 24 can serve as a respective anode and cathode connections supplying the LED chips 14 with current sufficient to cause light emission. First and second lead components 22 and 24 can comprise a metal or any other suitable electrically conducting material known in the art. First lead component 22 can comprise a respective substrate portion 36, a medial end 38, an opposing terminal end 40, a tab portion 42, at least one aperture 44, and one or more bends, for example, first and second bends 46 and 48, respectively. First aperture 44 can form one or more lead segments within first lead component 22. For example, in one aspect first lead component 22 comprises one aperture 44 and two lead segments 50 and 52. Second lead component 24 can be adjacent and symmetrical with respect to first lead component 22. Additionally, second lead component 24 can comprise features similar in both form and function to features of first electrical lead component 22. For example, second lead component 24 can comprise a respective substrate portion 56, a medial end 58, an opposing terminal end 60, a tab portion 62, at least one aperture 64, and one or more bends, for example, first and second bends 66 and 68, respectively. Each respective lead component 22 and/or 24 can comprise one or more notches N which can become retained within body 12 at exterior walls 15 and 19. The one or more notches N can assist with and handling and placement of LED package 10. For example, notches N can provide areas which a leadframe having an array of package housings retains the housings in place until the appropriate time when the LED packages 10 are singulated. The one or more bends, for example, respective first and second bends 46, 48, 66, and/or 68 can be defined in lead components 22 and 24 before, during, or preferably after formation of body 12 of LED package 10. Referring to second lead component 24, second aperture 64 can form one or more lead segments within second lead component 24. For example, in one aspect second lead component 24 comprises one aperture 64 and two lead segments 61 and 63. Any number of apertures and/or lead segments can exist in a given electrical lead component.

Tab portions 42 and 62 can oppose first and second medial ends 38 and 58. Upon formation of body 12, first and second tab portions 42 and 62, respectively, can extend outwardly away from a center of LED package 10 and terminate at respective distal ends 40 and 60. Apertures 44 and 64 of respective lead components 22 and 24 can separate substrate portions 36 and 45 into multiple electrical lead segment, for example, 50, 52, 61, and 63. In one embodiment, each of lead components 22 and 24 can include multiple apertures serving to separate the components into more than two (e.g., three or more) electrical lead segments. A first portion of each aperture 44 and 64 can be filled with the same material forming the body 12. A second portion of each aperture 44 and 64 can be disposed outside exterior walls 17 and 21 of body 12 such that individual electrical lead segments 50, 52, 61, and 63 can be separated from each of the remaining lead segments 50, 52, 61, and 63 by the apertures 44 and 64 along exterior walls 17 and 21 of the body 12. Each lead component 22 and 24 can comprise respective first and second bends 46, 48, 66, and 68. Bends 46, 48, 66, and 68 can comprise first and second bent portions 47 and 67, respectively. Bent portions 47 and 67 can be orthogonal to each of respective substrate portions 36 and 56 and tab portions 42 and 62 of first and second lead components 22 and 24, respectively. Bent portions 47 and 67 can be disposed between corresponding substrate portions 36 and 56 and tab portions 42 and 62. In addition, bent portions 47 and 67 can comprise perpendicular elements downwardly along exterior walls 17 and 21 of body 12. Bent portions 47 and 67 can comprise transition areas transitioning linear substrate portions 36 and 56 of first and second lead components 22 and 24, respectively, perpendicularly into respective linear tab portions 42 and 62. Tab portions 42 and 62 can be located parallel and along a different plane from corresponding substrate portions 36 and 56. Bent portions 47 and 67 can transition respective substrate portions 36 and 56 into the respective tab portions 10 and 62.

One or more apertures, for example apertures 44 and 64 can extend at least partially into first bends 48 and 68 of respective lead components. Apertures 44 and 64 can provide multiple benefits including promoting secure retention of lead components 22 and 24 within the body. In addition, apertures 44 and 64 can reduce the amount of lead material (e.g., metal) subject to being bent to form the first bends 46 and 66. This can reduce the cost of the overall package and reduce an amount of bending force required to form first bends 46 and 66. Bending can position at least a portion of each electrical lead component 22 and 24 into first and second tapered portions 25 and 27 (FIG. 9) of body 12.

Figure 12A:
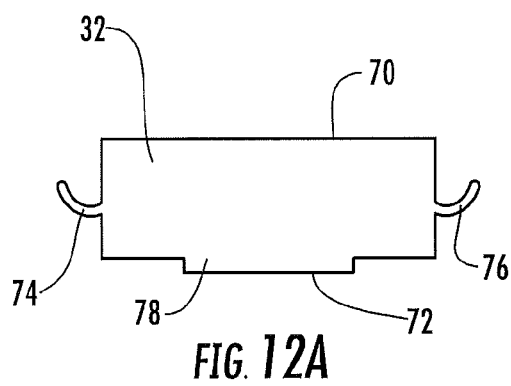
FIGS. 12A and 12B illustrate LED packages according to an aspect of the subject matter herein.
Figure 12B:
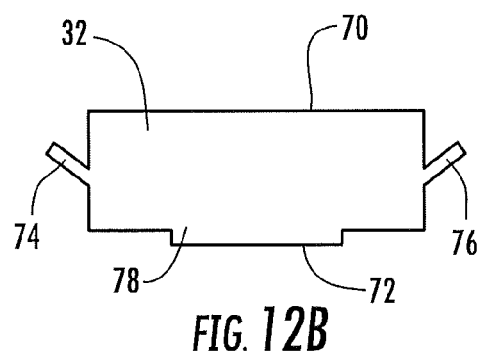

As FIG. 3 illustrates, heat transfer material 32 can comprise an upper surface 70, a lower surface 72, and one or more lateral protrusions, for example first and second lateral protrusions 74 and 76, respectively. Heat transfer material 32 can optionally comprise a lower protrusion 78 comprising lower surface 72 which can extend from recess 80 disposed in the lower face 13 of LED package 10. Lateral protrusions 74 and 76 can promote secure retention of the heat transfer material 32 by body 12 and can also reduce a potential for leakage (e.g., of solder and/or encapsulant) along interfaces between body 12 and the heat transfer material 32. Such lateral protrusions 74, 76 can be varied in number, size, shape, and/or orientation (FIGS. 12A and 12B). Heat transfer material 32 can conduct heat away from LED chips 14 and LED package 10 improving heat dissipation properties thereof.

Figure 4:
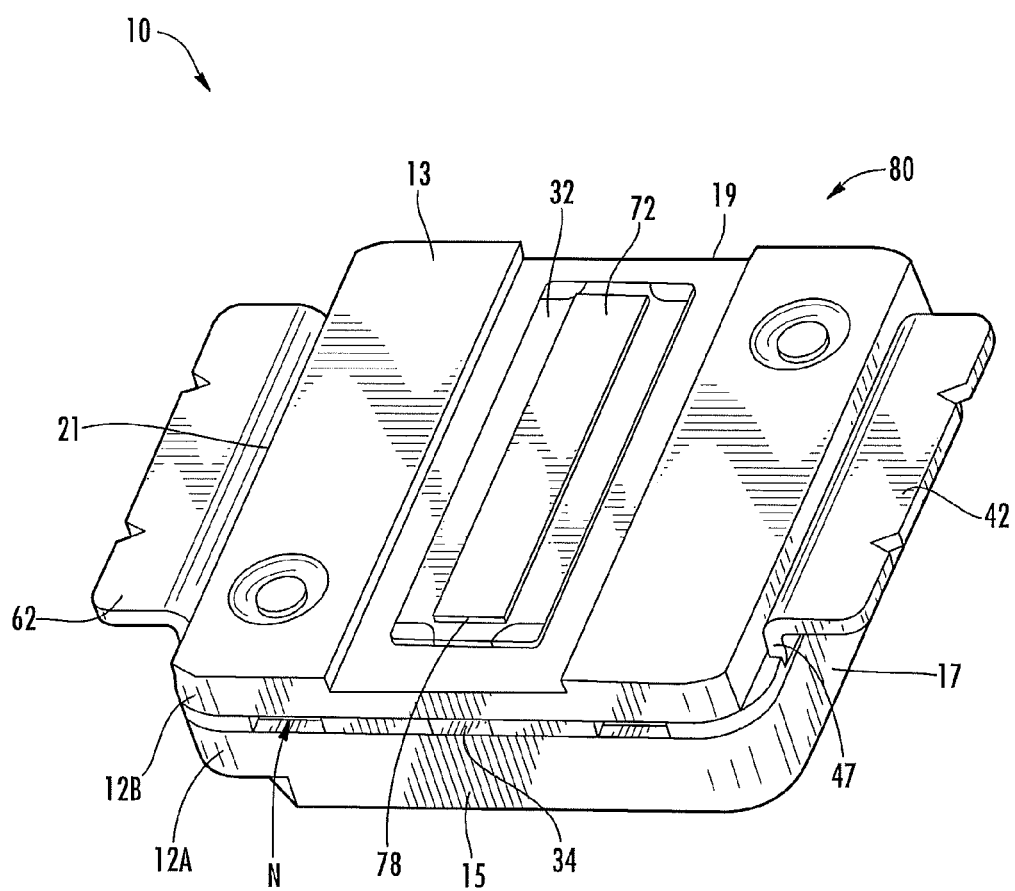
FIG. 4 illustrates a perspective bottom view of an LED packages according to an aspect of the subject matter herein.
Figure 6:
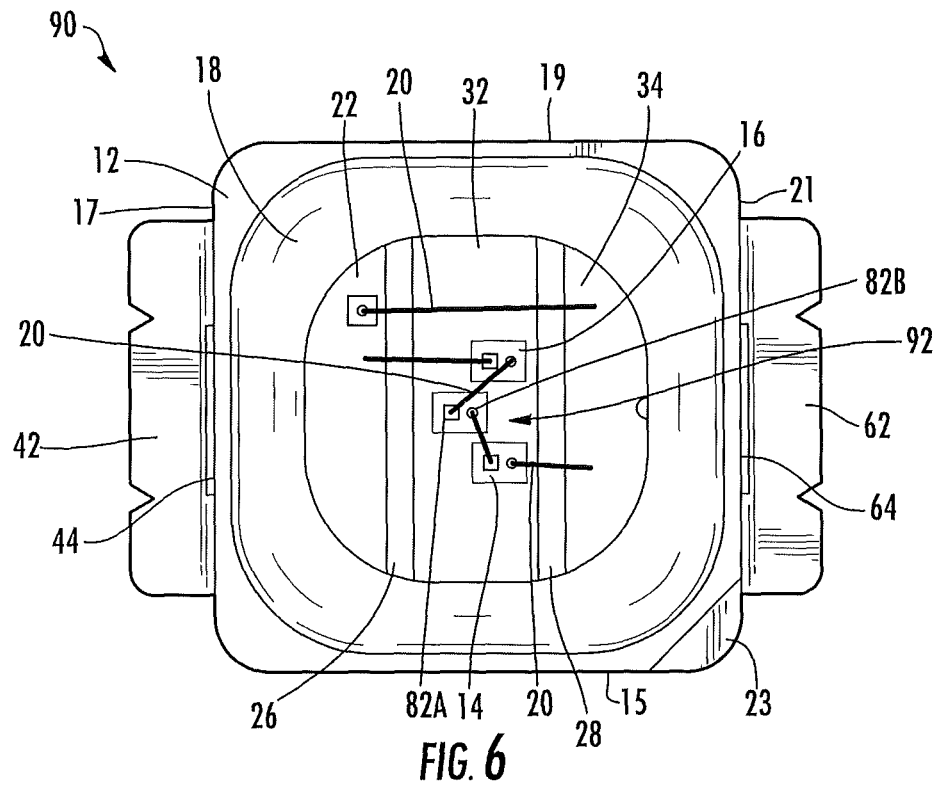
FIG. 6 illustrates a top plan view of LEDs according to an aspect of the subject matter herein.
Figure 7:
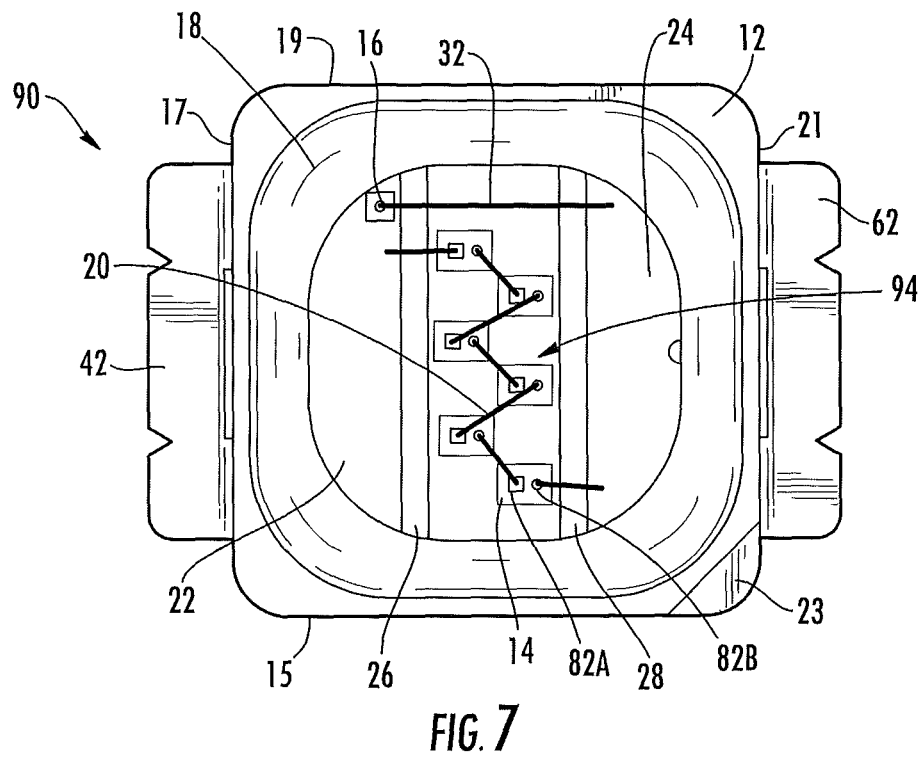
FIG. 7 illustrates a top plan view of LEDs according to an aspect of the subject matter herein.
Figure 8:
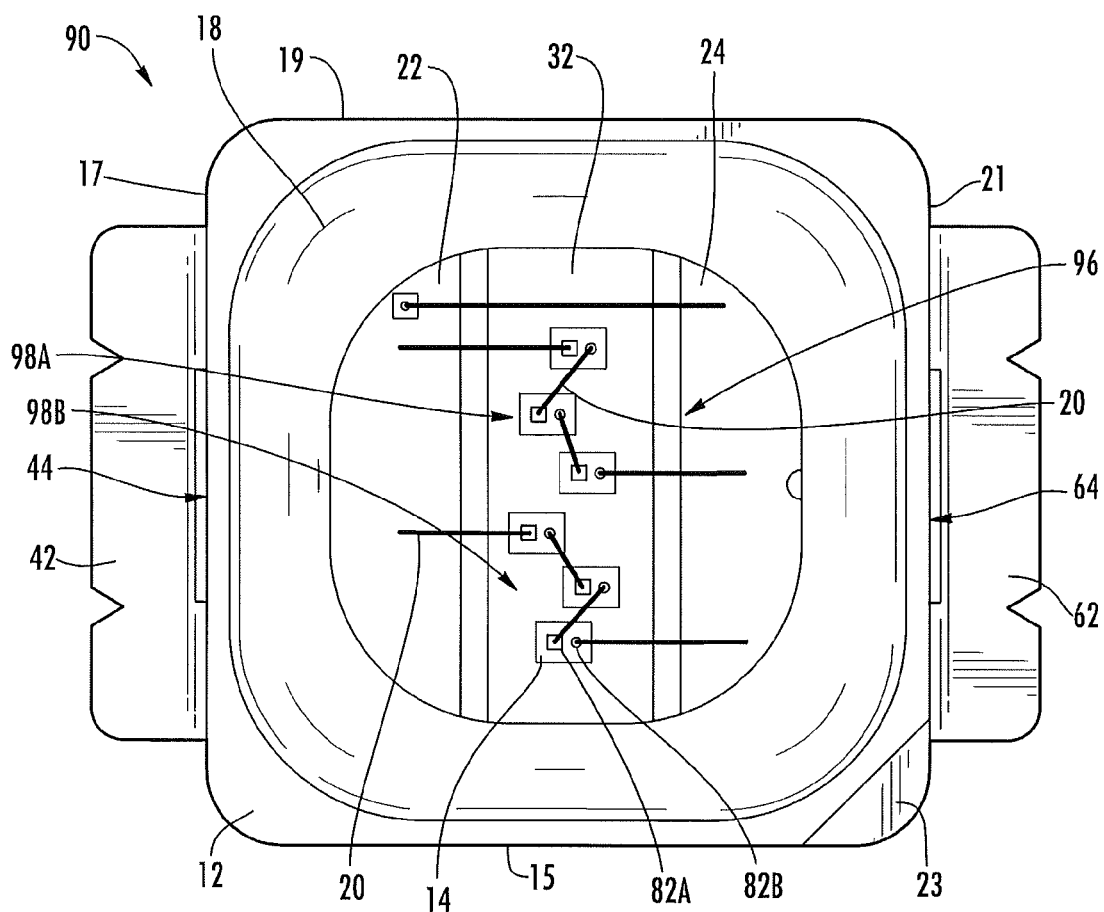
FIG. 8 illustrates a top plan view of LEDs according to an aspect of the subject matter herein.

FIG. 4 illustrates a perspective bottom view of LED package, generally designated 10. The bottom view can also be representative of a higher voltage LED package 90 (FIGS. 6 to 8). LED package 10 can comprise body 12 forming about leadframe element 30 and heat transfer material 32. Heat transfer material 32 can extend from a recess 80 formed in lower face 13 of LED package 10. In one aspect, heat transfer material 32 can comprise bottom surface 72 flush with recess 80 of LED package 10. In other aspects, heat transfer material 32 can comprise lower protruding portion 78 extending from recess 80 of LED package 10. Lower protrusion 78 can comprise any height and width dimension known in the art. Recess 80 can provide a space thereby allowing any overflow of attachment materials (not shown), for example, solder and/or flux to move into recess 80. This feature can eliminate or reduce the need to clean residue left behind by an attachment process, for example, using a "no-clean" solder. Recess 80 can also allow more access for solvents to remove flux after the reflow process if using for example, a "clean" solder which must undergo a cleaning process. Because of process variability, the amount of solder and/or flux that can be dispersed for connecting components, such as heat transfer material 32 and an external circuit (not shown), for example a printed circuit board (PCB) can vary significantly. As solder and/or flux can be very difficult to remove from substrates such as PCBs, recess 80 provides a space for any excess solder and/or flux to flow into thereby producing the area(s) needing cleaning afterwards. One or more exposed portions (FIG. 10) of heat transfer material 32 can also be positioned or otherwise located within recess 80.

Still referring to FIG. 4, first and second tab portions 42 and 62 of respective first and second lead components 22 and 24 can outwardly extend from approximately a center portion of LED package 10 and bend externally to comprise substantially horizontal components. In the alternative, tab portions 42 and 62 can extend from LED package 10 and bend inwardly towards each other. Thus, tab portions 42 and 62 may comprise a "J-bend" and/or "gull-wing" type of orientation as known in the art. Tab portions 42 and 62 can be substantially flush with lower face 13 of LED package. Tab portions 42 and 62 can electrically connect and mount over an external circuit and heat sink (not shown), for example, a PCB using any attachment method and materials desired. For example, standard soldering techniques can connect tab portions 42 and 62, as well as heat transfer element 32 to an external circuit or substrate wherein solder can wet bottom surfaces of each component. Heat transfer material 32 can thermally connect to and mount over a heat sink and/or external circuit. Such attachment methods can further comprise for example, soldering LED package 10 and PCB in a reflow oven or placing LED package10 and PCB on a hotplate. Any suitable solder material desired and capable of securing thermal and electrical components, that is heat transfer material 32 and tabs 42 and 62 of respective lead components 22 and 24 to PCB may be used. For example, attachment materials can comprise solder pastes of gold, tin, silver, lead and/or copper (Au, Sn, Ag, Pb, and/or Cu), reflow solder flux, and/or any combination thereof. For example, Sn 96.5/Ag 3.0/Cu 0.5 is a common Pb-free solder as is Sn 95.5/Ag 3.8/Cu 0.7.

Heat transfer material 32 as illustrated by FIG. 4 can comprise a single component formed integrally as one piece or it can comprise several components assembled together using any assembling process desired and/or known in the art. For example, lower protruding portion 78 can be formed integrally as one piece of heat transfer material 32 or can assemble to heat transfer material 32 such that it extends from a base portion of heat transfer material 32. In one aspect, heat transfer material 32 can comprise an intermediary thermal structure for transferring heat to another structure such as a heat transfer layer or a heat sink for further heat dissipation. In this aspect, heat transfer material 32 can comprise a thermal structure with limited heat capacity and capable of heating up quite quickly if not effectively connected thermally to a further heat transfer device such as an actual heat sink.

Figure 5:
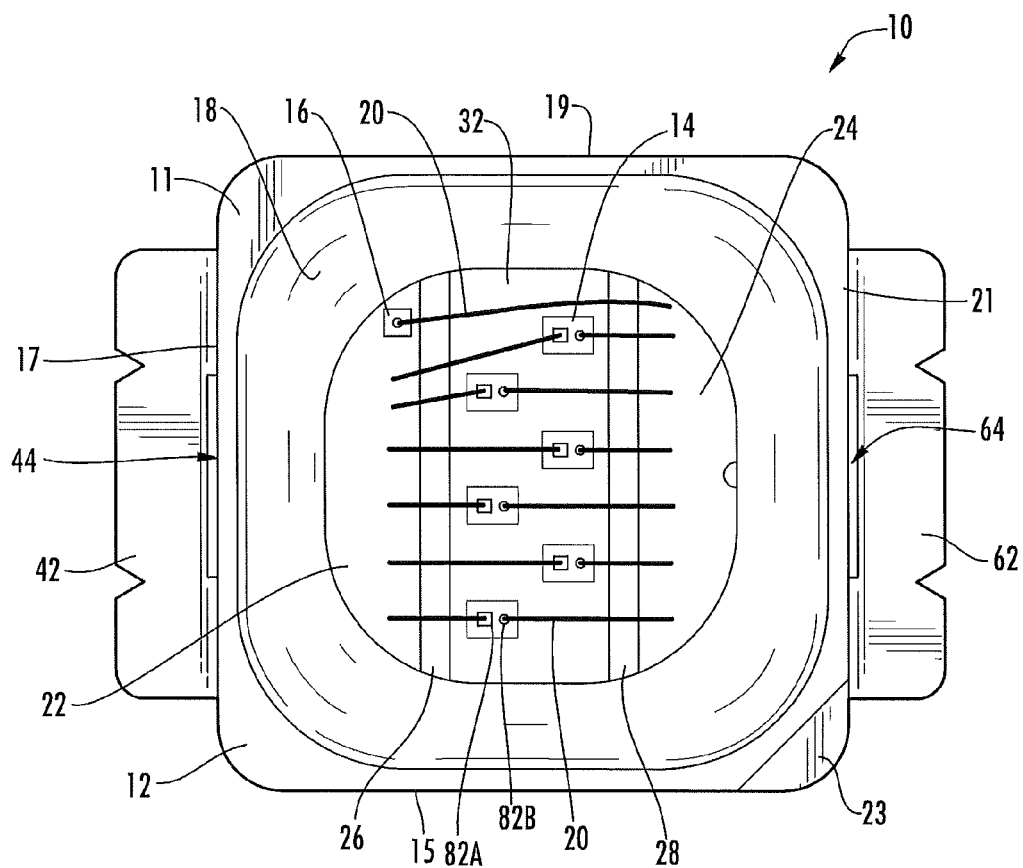
FIG. 5 illustrates a top plan view of the LED package shown in FIG. 1.

FIGS. 5 to 8 illustrate top views of LED packages, generally designated 10 and 90, the packages comprising variable arrangements of LED chips 14. One or more LED chips 14 can be arranged over thermal component, for example, heat transfer material 32, and the arrangements can vary depending upon the application. FIG. 5 illustrates one or more LED chips 14 disposed in electrical communication with each of first and second lead components, 22 and 24, respectively. LED chips 14 can electrically connect to first and second lead components 22 and 24 using conductive wires 20 such that a first portion 82A of LED chip 14 electrically connects to first electrical lead component 22 and a second portion 82B of LED chip electrically connects to second electrical lead component 24. First portion 82A and second portion 82B of LED chip 14 can comprise different electrical polarity, that is, one of first and second portions 82A and 82B, respectively, acts as an anode and the remaining portion acts as a cathode such that electrical current can be driven through each LED chip 14 thereby generating light emission. As FIG. 5 illustrates, connecting each of the one or more LED chips 14 of a plurality of chips to each of the first and second lead components 22 and 24 comprises a first arrangement, or electrical configuration. In this electrical configuration, each LED chip 14 can be arranged in parallel with the remaining LED chips 14 of the plurality. That is, each LED chip 14 can receive less than or approximately the same voltage from a power source, enabling lower voltage power sources to be used. When arranged in parallel, LED chips 14 can also mount over heat transfer material 32. In one aspect, LED chips can mount directly to heat transfer material 32. In the alternative, LED chips 14 can mount to one or more intervening substrates (not shown) disposed between LED chip 14 and heat transfer material 32.

The LED configuration described and illustrated by FIG. 5 allows a package to operate with a power source comprising, for example, approximately 3.2 volts (V). In some applications, it may be desirable for LED packages to operate at lower voltages, for example, of less than approximately 3.2 V, for example, approximately 1.5 to 2 V or approximately 2 V to 3.2 V. In other applications, it may be desirable for LED packages to operate at higher voltages. FIGS. 6 to 8 illustrates examples, without limitation, of LED packages, generally designated 90, which can be operable for applications having voltage greater than approximately 3.2 V. For example, in one aspect, LED package 90 may be operable within a range of approximately 3.2 to 5 V. In other aspects, LED package 90 can be operable within a range of 5 to 10 V. In other aspects, LED package 90 can be operable within a range of approximately 10 to 20 V. In further aspects, LED package 90 can be operable at voltages greater than 20 V. LED package 90 can comprise variable arrangements of LED chips 14 within the package, and having the remaining features of LED package 90 of similar form and function as described with respect to LED package 10. For example, LED package 90 can comprise a molded body 12 about leadframe element 30 (FIGS. 1 to 4), the leadframe comprising heat transfer material 32 and first and second lead components 22 and 24, respectively.

FIGS. 6 to 8 illustrate higher voltage packages, such as LED package 90. In accordance with the subject matter herein, higher voltage packages can be accomplished in part by varying the arrangement, or electrical configuration, of LED chips 14 within the package. For example, FIGS. 6 to 8 illustrate LED package 90 comprising one or more LED chips 14 electrically connected in series with at least one other LED chip 14. LED package 90 can comprise a first lead component 22 and a second lead component 24. One of the first and second lead components 22 and 24, respectively, can operate as a cathode and the remaining as an anode for supplying current to the one or more LED chips 14. First and second lead components 22 and 24, respectively, can protrude and/or extend outwardly from the body for example, from a lateral side and/or a bottom surface of the LED package 90. Lead components 22 and 24 can bend externally forming bent portions 47 and 67 which can extend downwardly and parallel external sides 17 and 21. LED package 90 can comprise first and second lead components 22 and 24 extending from a center portion of the body and bending externally to form linear, outwardly extending first and second tab portions 42 and 62, respectively. One or more LED chips 14 can electrically communicate to first and/or second lead components 22 and 24 by using one or more electrically conductive wires 20. First and second lead components 22 and 24 can also be electrically and/or thermally isolated from a heat transfer material 32 upon which the one or more LED chips 14 may be directly or indirectly mounted. One or more isolating portions 26 and 28 of the LED package 90 can thermally and/or electrically isolate heat transfer material 32 from first and second lead components, 22 and 24, respectively.

FIGS. 6 to 8 illustrate LED chips 14 comprising variable arrangements and electrical configurations within LED package 90. That is, one or more LED chips 14 can be connected to first and second lead components 22 and 24, respectively, in series, parallel, and/or a combination thereof. This can be accomplished using a wirebonding process wherein one or more LED chips 14 can electrically connect in series to another LED chip 14 using one or more conductive wires 20. The first and last LED chips 14 of a given series can then connect to first and second lead components 22 and 24, respectively, using conductive wires 20 for driving current through the LED chips 14. When LED chips 14 are wired in series, the voltage from a power source can be divided, or otherwise dispersed, between LED chips 14. That is, a higher power source can be used with LEDs, LED packages, and methods because the voltage will be divided across the series of one or more LED chips 14. The higher voltage generated by the power source can comprise a series of respective lower voltages passing through each individual LED chip 14. As disclosed previously, the power source voltage can operate in a range from 5 to 20V for some applications, and in other applications it may be desirable to operate at greater than 20V.

FIG. 6 illustrates an arrangement of LED chips 14, the arrangement generally designated 92. Arrangement 92 comprises three LED chips 14 arranged in an electrical configuration. Here, LED chips 14 are illustrated as electrically connected in a series arrangement. The first LED chip 14 of the series can be connected to first lead component 22 and the final LED chip in the series arrangement can be connected to second lead component 24. This is similar to an alternative arrangement illustrated in FIG. 7, generally designated 94, of LED chips 14 within LED package 90. Arrangement 94 comprises six LED chips electrically connected in a series arrangement within LED package 90. The first LED chip 14 of the series can be electrically connected to first lead component 22, and the final LED chip 14 of the series comprising arrangement 94 can be electrically connected to second lead component 24. The respective first and last LED chips 14 within a series connect to lead components such that current can be supplied to the entire series of LED chips 14. Arrangements 92 and 94 illustrated herein can comprise any number or type of LED chips 14. In general, series arrangements can be more efficient if the same type of LED chip 14 is used such that voltage distributes, or otherwise disperses consistently and evenly through each chip in the series.

FIG. 8 illustrates an arrangement comprising LED chips 14 mounted in a combination utilizing both series and parallel electrical configurations. For example, FIG. 8 illustrates an arrangement, generally designated 96. Arrangement 96 can comprise, for example, two groups of three LED chips 14, wherein at least one LED chip 14 comprising each group can be electrically connected in series to at least one other LED chip 14 within the respective group. A first group LED chips, generally designated 98A can then electrically connect in parallel with a second group of LED chips, generally designated 98B. Each of the first and second groups 98A and 98B, respectively, can comprise one or more LED chips 14 electrically connected in series, the first and last LED chips 14 comprising each of the respective series can connect to first and second lead components 22 and 24, respectively. Thus, arrangement 96 utilizes electrical configurations comprising each of a series configuration and a parallel configuration, wherein each of first and second groups 98A and 98B comprises one or more LED chips 14 connected in series while first group 98A can connect in parallel to second group 98B. Note that arrangements 92, 94, and 96 depicted in FIGS. 6 to 8, can comprise any number of chips mounted in a series, not limited to the arrangements shown. Arrangement 96 can likewise comprise any number of groups connected in parallel. When wiring in series, attention should be given to assure the correct LED terminal of respective LED chips 14 are wirebonded to electrically connect the chips. As depicted earlier, LED chips 14 can comprise a first portion 82A and a second portion 82B, the portions comprising different electrical polarities. That is, the first portion 82A can comprise negative terminal and the second portion 82B can comprise a positive terminal or vice versa. When connecting LED chips in series, first portion 82A of a preceding LED chip 14 should preferably become wirebonded and electrically connected to second portion 82B of a subsequent LED chip 14. Otherwise, the LED chips 14 may not illuminate as current may not adequately be supplied to the series. As disclosed previously, arrangement 96 can comprise any number of groups and is not limited to the first and second groups, 98A and 98B as shown. The combination of LED chips mounted in both series and parallel can be adjusted for a given application and/or desired voltage source. Thus, LED chips 14 can advantageously be connected either in parallel, in series, or using a combination thereof to accommodate various voltage applications.

Still referring to FIGS. 6 to 8, for illustration purposes and without limitation, LED chips 14 are illustrated as arranged in series in a zigzag configuration of series alignment or design although any suitable alignment or configuration of the LED chips can be used. For example, and without limitation, LED chips 14 may be arranged in series horizontally and/or vertically, in a grid or in an array or even in a combination thereof. Also, regarding different applications using LED packages, and in general, wiring objects in parallel can drain a power supply faster than wiring objects in series, as objects in parallel can end up drawing more current from the power supply. It can also be helpful if all of the LEDs chips being used have the same power specifications.

Figure 9:
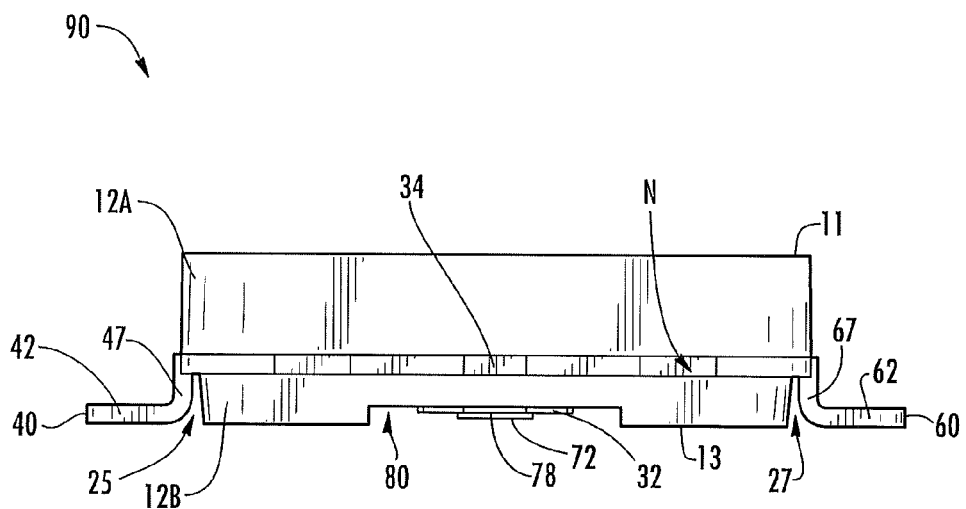
FIG. 9 illustrates a side view of LED packages according to an aspect of the subject matter herein.

FIG. 9 illustrates a side view of LED package, generally designated 90. FIG. 9 could also illustrate LED package 10, as each of LED packages 10 and 90 could comprise similar features of similar form and function with the exception of an arrangement of LED chips 14 within the packages. FIG. 9 illustrates body 12 comprising upper body portion 12A and lower body portion 12B as may be formed, for example, in upper and lower molding die portions (not shown) respectively. One or more tapered portions, for example first and second tapered portions 25 and 27 can be defined by exterior side walls 17 and 21 of body 12 and can be adjacent to (e.g., below) locations where first and second lead components 22 and 24 extend through the exterior side walls 17 and 21. Such first and second tapered portions 25, 27 can be arranged to receive the bent portion 47, 67 or at least part of the thickness of the bent portion 47, 67 of first and second lead components 22 and 24. Each of first and second tapered portions 25 and 27 can comprise a depth relative to the corresponding exterior side wall 17 and 21. The depth of each first and second tapered portion 25 and 27 can preferably comprise a depth substantially equal to or greater than an average thickness of the first and second electrical lead components 22 and 24, respectively. First and second tapered portions 25 and 27 can provide multiple benefits. For example, first and second tapered portions 25 and 27 can substantially eliminate a presence of material immediately disposed below the first bends 46 and 66 thereby reducing an amount of stress applied to body 12 during formation of the first bends 46 and 66 which can form subsequent to the leadframe element 30 being retained in body 12. Another benefit of first and second tapered portions 25 and 27 is to enable each of first bends 46 and 66 to have a tighter bending radius. This can reduce or eliminate outward extension of the bent portions 47 and 67 which can be substantially parallel to external walls 17 and 21 and at least substantially perpendicular to lower face 13 and first and second lead components 22 and 24 thereby reducing the effective footprint of LED package 10. Reduction of effective footprint of LED packages can enable such packages 10 to be mounted in higher densities upon an external substrate (not shown), and/or optionally overlaid with a Lambertian reflector or diffuser having reduced hole spacing (e.g., within a backlit display device, such as a LCD display). Thus, tapered portions 25 and 27 can enable LED packages such as 10 and 90 to exhibit enhanced light performance by enabling higher flux density and/or greater lighting uniformity.

Figure 10:
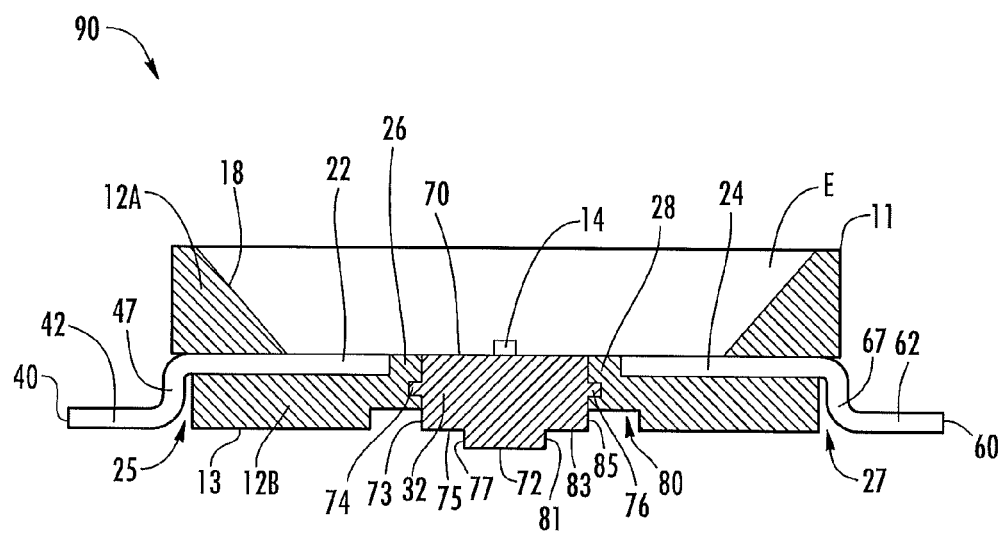
FIG. 10 illustrates a cross sectional view of LED packages according to an aspect of the subject matter herein.

FIG. 10 illustrates a cross-sectional view of LED package 90. Reflector cavity 18 can be filled, coated, or otherwise covered with an encapsulant E. Encapsulant E can comprise any suitable material known in the art and can optionally comprise a phosphor or a lumiphor to interact with light emitted by the one or more LED chips 14 and responsively emit light of a desired wavelength spectrum. For illustration purposes, encapsulant E is shown as disposed and filling reflector cavity 18 essentially flush with an upper face 11 of body 12. Encapsulant E, however, may be filled to any suitable level within the reflector cavity 18 or even exceed and extend above reflector cavity 18.

FIG. 10 illustrates one or more exposed portions of heat transfer material 14. For example, heat transfer material 32 can comprise exposed portions 73, 75, 77, 72, 81, 83, and 85 protruding from and disposed within recess generally designated 80 of LED package 90. Each exposed portion 73, 75, 77, 72, 81, 83, and 85 can comprise an external surface of heat transfer material 32, which can be formed integrally as one piece or from more than one portion such as protruding portion 78 illustrated in FIGS. 3 and 4. FIG. 10 also illustrates heat transfer material 32 extending the full thickness of lower portion 12B of body 12. First and second lead components 22 and 24, respectively, rest above lower portion 12B of body 12 and can be disposed between the respective upper 12A and lower 12B portions of body 12. As illustrated by FIGS. 3 and 4, first and second lead components 22 and 24 can comprise substrates 36, 56 which can be located on a parallel plane above respective tab portions 42 and 62 and orthogonally arranged with respect to bent portions 47 and 77.

Figure 11A:
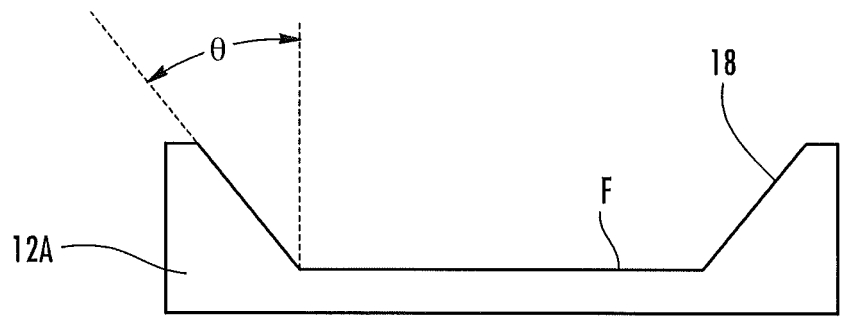
FIGS. 11A and 11B illustrate LED packages according to an aspect of the subject matter herein.
Figure 11B:
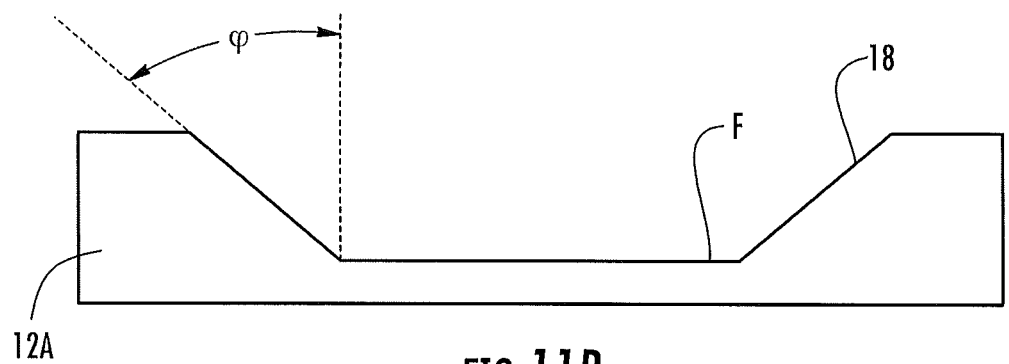

FIGS. 11A and 11B illustrate simplified schematic cross-sectional views of body 12 which can form LED package 10 and/or 90. LED packages can comprise reflector cavity 18 bounded by a floor F. Floor F can comprise portions of first and second lead components 22 and 24, isolating portions 26 and 28, as well as top surface 70 of heat transfer material 32. Reflector cavity 18 can be bounded along edges by external side walls 15, 17, 19, and 21. Reflector cavity 18 can comprise any shape, for example, reflector cavity 18 can comprise a rounded wall defining rounded reflector cavity 18 or reflector cavity 18 can comprise inner walls defining a substantially square reflector cavity 18. Reflector cavity 18 can comprise any size and/or shape known in the art. Reflector cavity 18 can comprise one or more portions which can transition from inclined portions and/or substantially straight portions with walls perpendicular external walls 15, 17, 19 and 21. For example, reflector cavity 18 can comprise a first portion having angle θ relative to a plane perpendicular to floor F. Similarly, and possibly in the same package, reflector cavity 18 can comprise an angle φ relative to a plane perpendicular to floor F. In one aspect, reflector cavity 18 comprises an incline angle θ of at least approximately 20 degrees. In another aspect, angle θ can comprise at least approximately 30 degrees. In further aspects, angle θ can comprise at least approximately 40 degrees. Incline angle θ can also comprise at least about 45 degrees, or at least about 50 degrees.

Referring to FIG. 11B, reflector cavity can comprise inclined at an angle φ of at least about 30 degrees, at least about 40 degrees, or at least about 50 degrees. In further embodiments, the angle φ can comprise about 55 degrees, or at least about 60 degrees. Such angles θ and φ can be greater than typically employed in conventional LED packages. Although the reflector cavity 18 portions described herein can comprise straight walls angled from the floor of the cavity to the upper edge of the package, alternative embodiments may comprise segmented and/or curved cross-sections, that is, the wall extending from the floor F to the upper edge of the package can comprise non-linear cross-sections along at least a portion thereof. If such walls are curved or segmented, then the inclination angles mentioned above may correspond to an average angle of a curved or segmented wall, or an angle between endpoints of such a wall. Reflector cavities 18 comprising alternating angles enables a frontal area of the reflector cavity 18 to be maximized relative to the square-shaped upper face 11, while providing desirably diffuse output beam characteristics, particularly when multiple LEDs are disposed within reflector cavity 18.

Referring to FIGS. 12A and 12B, alternative embodiments of heat transfer material 32 are illustrated. Heat transfer material 32 can comprise upper surface 70, lower surface 72, lower protruding portion 78, and lateral protrusions 74 and 76 protruding outward from lateral side walls of the material. FIG. 12A discloses lateral protrusions 74 and 76 which can be non-linear and curve upwardly. FIG. 12B illustrates an alternative embodiment wherein heat transfer material 32 comprises upwardly angled, or otherwise tapered, lateral protrusions 74 and 76 extending outward and upward from side walls of heat transfer material 32. Lateral protrusions 74 and 76 can comprise any size, shape, and/or arrangement desired. For example, downwardly curved and/or angled lateral protrusions may be employed. Likewise, any combinations of the foregoing lateral protrusions may be employed. Lateral protrusions may be formed using any suitable manufacturing method known in the art. For example, stamping, forging, extruding, milling, and/or machining may be used to form lateral protrusions 74 and 76. In some cases, lateral protrusions 74 and 76 can be replaced with, or supplemented by, recesses (not shown) in external side walls of heat transfer material 32 to provide a similar sealing utility, with such recesses being formable using similar methods outlined above. Heat transfer material 72 can comprise a surface upon which one or more LED chips 14 can mount over and wherein a reflector cavity 18 can be disposed about the LED chips 14.

Embodiments of the present disclosure shown in the drawings and described above are exemplary of numerous embodiments that can be made within the scope of the appended claims. It is contemplated that the configurations of LED devices, methods, and packages capable of higher voltage applications can comprise numerous configurations other than those specifically disclosed.

What is claimed is:

1. A light emitting device, the device comprising:
   a package body;
   a leadframe comprising a first lead component and a second lead component;
   a thermal element that is thermally and electrically isolated from the first and second lead components via portions of the package body; and
   a first group of LEDs arranged over the thermal component, wherein the first group of LEDs comprises a first LED electrically connected in series to a second LED; and
   wherein the package body is formed about a portion of the thermal element and a portion of each of the first and second lead components.

2. The light emitting device according to claim 1, wherein the package body comprises a molded plastic body.

3. The light emitting device according to claim 1, wherein the first group of LEDs is electrically connected in parallel to a second group of LEDs.

4. The light emitting device according to claim 3, wherein the second group of LEDs comprises a preceding LED electrically connected in series to a subsequent LED.

5. The light emitting device according to claim 4, wherein the first group comprises LEDs arranged in a first zigzag configuration and the second group comprises LEDs arranged in a second zigzag configuration.

6. An arrangement of light emitting diodes (LEDs), the arrangement comprising:
   a first group of LEDs comprising a first LED electrically connected in series to a second LED; and
   a second group of LEDs;
   wherein the first group of LEDs is electrically connected in parallel to the second group of LEDs; and
   wherein the first and second groups of LEDs are electrically connected to first and second lead components.

7. The arrangement according to claim 6, wherein the second group of LEDs comprises a preceding LED electrically connected in series to a subsequent LED.

8. The arrangement according to claim 6, wherein the first and second groups of LEDs are arranged over a thermal element.

9. The arrangement according to claim 8, comprising a package body molded about a portion of each of the first and second lead components wherein the package body is molded about a lateral protrusion of the thermal element, the package body forming a cavity disposed about the first and second groups of LEDs.

10. The arrangement according to claim 9, wherein the package body comprises encapsulant in at least a portion of the cavity.

11. The arrangement according to claim 9, wherein the package body comprises a recess formed in a bottom surface of the package body.

12. A method of arranging light emitting diodes (LEDs) within a package, the method comprising:
   providing a package body;
   providing a first group of LEDs wherein a first LED in the first group is electrically connected in series to a second LED in the first group;
   providing a second group of LEDs;
   electrically connecting the first group of LEDs in parallel with the second group of LEDs within the package body; and
   encapsulating at least some of the LEDs in the first or second groups of LEDs.

13. The method according to claim 12, wherein providing the second group of LEDs comprises providing a second group of LEDs comprising a preceding LED electrically connected in series to a subsequent LED.

14. The method according to claim 12, further comprising electrically connecting each of the first and second groups of LEDs to first and second lead components.

15. The method according to claim 14, further comprising arranging the first and second group of LEDS within a package body such that each of the first and second groups comprises a zigzag series configuration.

16. The method according to claim 15, wherein the package body comprises molded plastic.

17. The method according to claim 16, further comprising filling at least a portion of the package body with an encapsulant comprising a phosphor.

* * * * *